(12) United States Patent
Ohsawa et al.

(10) Patent No.: US 8,988,882 B2
(45) Date of Patent: Mar. 24, 2015

(54) HEAT SINK PACKAGE AND METHOD OF MANUFACTURING

(75) Inventors: Kenji Ohsawa, Kagoshima (JP); Rinkou Fukunaga, Kagoshima (JP); Katsuya Tsuruta, Kagoshima (JP); Kei Mizuta, Kagoshima (JP); Masamichi Ishihara, Kitakyushu (JP)

(73) Assignees: Molex Japan Co., Ltd., Yamato (JP); Kagoshima University, Kagoshima (JP)

( * ) Notice: Subject to any disclaimer, the term of this patent is extended or adjusted under 35 U.S.C. 154(b) by 502 days.

(21) Appl. No.: 13/259,563

(22) PCT Filed: Mar. 24, 2010

(86) PCT No.: PCT/JP2010/055014
§ 371 (c)(1),
(2), (4) Date: Feb. 6, 2012

(87) PCT Pub. No.: WO2010/110281
PCT Pub. Date: Sep. 30, 2010

(65) Prior Publication Data
US 2012/0127667 A1    May 24, 2012

(30) Foreign Application Priority Data
Mar. 27, 2009   (JP) ................ 2009-077954

(51) Int. Cl.
*H05K 7/20*    (2006.01)
*H01L 23/498*    (2006.01)
(Continued)

(52) U.S. Cl.
CPC ........ *H01L 23/49816* (2013.01); *H01L 23/367* (2013.01); *H01L 23/4334* (2013.01); *H01L 21/4867* (2013.01); *H01L 2224/16225* (2013.01); *H01L 2924/15321* (2013.01)
USPC ........... 361/709; 361/704; 361/711; 361/713; 361/720; 174/252; 174/548

(58) Field of Classification Search
USPC ......... 361/704, 709, 710, 711, 713, 720, 723; 174/252, 548
See application file for complete search history.

(56) References Cited

U.S. PATENT DOCUMENTS 6,965,071 B2 *  11/2005  Watchko et al. .............. 174/377
7,547,975 B2     6/2009  Takaya et al.
(Continued)

FOREIGN PATENT DOCUMENTS

JP    1987-084713    10/1988
JP    1988-035929    9/1989
(Continued)

*Primary Examiner* — Hoa C Nguyen
*Assistant Examiner* — Binh Tran
(74) *Attorney, Agent, or Firm* — Timothy M. Morella (57) ABSTRACT

A circuit element is arranged on an organic substrate and connected to a wiring pattern arranged on the organic substrate. An internal connection electrode is formed on a conductive support body by electroforming so as to obtain a unitary block of the internal connection electrode and the support body. Each end of each of the internal connection electrodes connected into a unitary block by the support body is connected to the wiring pattern. After the circuit element is sealed by resin, the support body is peeled off, so as to obtain individual internal connection electrodes separately and the other end of each of the internal connection electrodes is used as an external connection electrode on the front surface while the external connection electrode on the rear surface is connected to the wiring pattern.

5 Claims, 10 Drawing Sheets (51) Int. Cl.
*H01L 23/367* (2006.01)
*H01L 23/433* (2006.01)
*H05K 1/00* (2006.01)
*H01L 21/48* (2006.01)

(56) References Cited

U.S. PATENT DOCUMENTS

| | | | |
|---|---|---|---|
| 7,903,410 | B2 | 3/2011 | Cho et al. |
| 8,017,452 | B2 | 9/2011 | Ishihara et al. |
| 2008/0218965 | A1* | 9/2008 | Tokunaga .................... 361/688 |
| 2009/0129432 | A1* | 5/2009 | Luniewski ................... 374/100 |

FOREIGN PATENT DOCUMENTS

| | | |
|---|---|---|
| JP | 1991-020243 | 9/1992 |
| JP | 05-29502 A | 2/1993 |
| JP | 1993-147164 | 1/1995 |
| JP | 3605547 | 2/2001 |
| JP | 3860425 | 9/2002 |
| JP | 2001-184167 | 1/2003 |
| JP | 2003-002226 | 7/2004 |
| JP | 2004-193054 | 1/2006 |
| JP | 2009-059771 A | 3/2009 |

* cited by examiner

HEAT SINK PACKAGE AND METHOD OF MANUFACTURING

REFERENCE TO RELATED APPLICATIONS

The Present Disclosure is a U.S. National Phase Application of PCT Patent Application No. PCT/JP2010/055014, entitled "Heat Sink-Combined Package, And Method Of Manufacturing Thereof," filed with the Receiving Office of the Japanese Patent Office (JPO) on 24 Mar. 2010. The PCT Application claims priority to prior-filed Japanese Patent Application No. 2009-077954, entitled "Heat Sink-Combined Package, And Method Of Manufacturing Thereof," filed on 27 Mar. 2009 also with the JPO. The contents of each of the aforementioned Patent Applications are fully incorporated in their entireties herein.

BACKGROUND OF THE PRESENT DISCLOSURE

The Present Disclosure relates, generally, to a heat sink package with electronic components mounted on a heat sink substrate, and to a method of manufacturing thereof.

Figure 16:
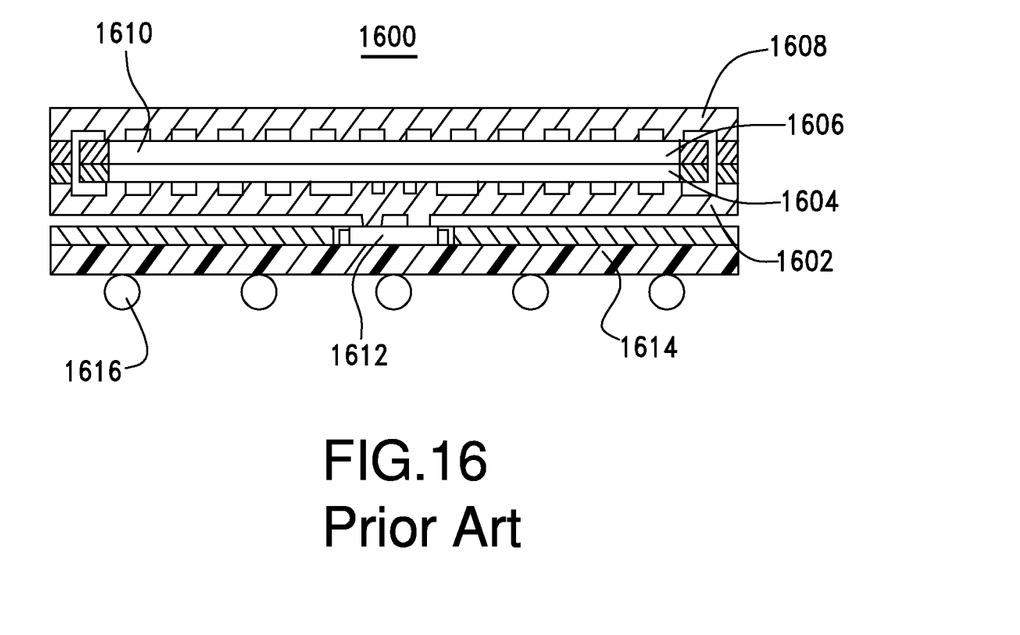
FIG. 16 is a cross sectional view of a conventional flat type heat pipe structure comprised of thin plate materials.

A variety of heat relief substrates are manufactured for use in power integrated circuits. FIG. 16 is a cross-sectional drawing showing a conventional flat heat pipe structure configured with thin sheet form material, generally as disclosed in Japanese Patent Application No. 2007-315745 (the content of which is incorporated herein in its entirety). In the heat pipe 1600 shown, a lower material 1602, a lower intermediate panel 1604, upper intermediate panel 1606 and upper material 1608 are formed into a single unit by being directly joined at their outer edge parts. As injection of coolant (not shown) into the inner space 1610 of the heat pipe 1600 proceeds, the holes for coolant injection (not shown) and holes for air ejection (not shown) become obstructed. As heat from the cooled device 1612 installed on the printed wiring board 1614 is absorbed by the coolant, and the coolant is thereby heated and evaporates, vapor dissipates from the peripheral side, and the vapor at the peripheral part of the heat pipe 1600 is released and condenses. Thus, the heat pipe 1600, illustrated in FIG. 16, is a wick configuration stacked in a net pattern so as to cause a capillary effect.

However, in such a heat pipe 1600, although it is possible to disperse the heat from the cooled device 1612 by means of evaporation and condensation of the coolant whereby the heat pipe 1600 is filled, the release of heat outside the heat pipe 1600 is not sufficient because heat remains trapped inside the chassis part. A structure for the purpose of further releasing heat from the peripheral part is thus desired.

Also, the heat pipe 1600 illustrated in FIG. 16 has electrodes 1616 for external connection, placed on the back surface of the printed wiring board 1614. When attempting to bring out external electrodes 1616 in a package whereby a heat sink 1600 is attached to the back side of a Large Scale Integrated Circuit Chip ("LSI Chip"), not only is a printed wiring board 1614 required as a mounting substrate for the cooled device 1612, but also wiring passing through it is required, which complicates manufacturing processes and increases cost.

A heat sink technology is, thus, desired that can facilitate wiring of external electrodes placed on the back side thereof. Note also that PCT Patent Application No. PCT/JP2007/072157 (the content of which is incorporated herein in its entirety) discloses a post electrode component with wiring attached made with an electroforming method as described below.

SUMMARY OF THE PRESENT DISCLOSURE

One embodiment of the Present Disclosure provides a heat sink package whereby external electrodes can easily be brought out by attaching the heat sink so that the heat sink itself is used as the mounting substrate for a LSI Chip, without requiring a mounted LSI Chip substrate, and also without requiring through wiring technology whereby through holes are formed in the mounting substrate and filled with metal material. Also, the Present Disclosure provides a simple heat sink device with a structure for releasing heat to the exterior from the heat sink, whereby heat is not trapped inside a chassis. Accordingly, cooling is achieved.

In a heat sink package according to the Present Disclosure, electronic components are mounted on a heat sink substrate, comprised of laminations of at least one metal layer, with each metal layer being extended, thereby forming a thermal connector which conducts heat generated by the electronic components to the outside. Electronic components are mounted on the heat sink substrate whereon wiring is formed, and electrode terminals of the electronic components are connected to necessary positions on the wiring. A post electrode component, comprising wiring having a horizontal wiring portion and a post electrode, is mounted on the heat sink substrate and is connected to wiring on the heat sink substrate, and an external electrode is formed connected to the horizontal wiring portion.

Also, in a manufacturing method for a heat sink package comprising electronic components mounted on a heat sink substrate according to the Present Disclosure, the heat sink substrate is comprised of laminations of at least one metal layer, whereby each metal layer is extended thereby forming a thermal connector conducting heat generated by the electronic components to the outside. Electronic components are mounted on the heat sink substrate whereon wiring is formed, and electrode terminals of the electronic components are connected to necessary positions on the wiring. A post electrode component with attached wiring, configured by connecting a horizontal wiring part and post electrode in one unit by means of a support plate, is mounted on the heat sink substrate and connects to wiring on the heat sink substrate. After filling with resin, the support plate is peeled off, forming an external electrode connected to a horizontal wiring part exposed by peeling.

The support plate for the horizontal post electrode part with wiring attached has a tape of insulating material affixed to the support plate, which is exposed by peeling off the support plate and thereby is caused to function as a protective film, and connection between the external electrode and the horizontal wiring part is made through holes opened in said protective film. The wiring on the heat sink substrate is formed by affixing the metal film fixing tape material to the heat sink substrate and patterning the metal film by means of lithography and etching.

By means of the Present Disclosure, it is possible in a heat sink package to easily bring out an external electrode by attaching and using the heat sink itself as a mounting substrate for an LSI Chip, without requiring any LSI Chip mounting substrate, and also without requiring through wiring technology opening holes in the mounting substrate and filling with metal material. Also, it is possible to provide a structure for the purpose of releasing more heat from the heat sink, without trapping heat inside the chassis, and thereby obtain major cooling effects.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which:

FIG. 10 (A) is a flat drawing of a multi-layer laminated plate (heat sink body) with a metal plate affixed, and (B) is a cross-sectional view of a section across Line P-P';

FIG. 11 (A) is a flat drawing of the state with plate affixed, and (B) is a cross sectional view of a section across line Q-Q';

FIG. 12 (A) is a flat drawing showing a completed heat sink substrate, and (B) is a cross-sectional view of a section across line R-R';

DESCRIPTION OF THE PREFERRED EMBODIMENTS

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
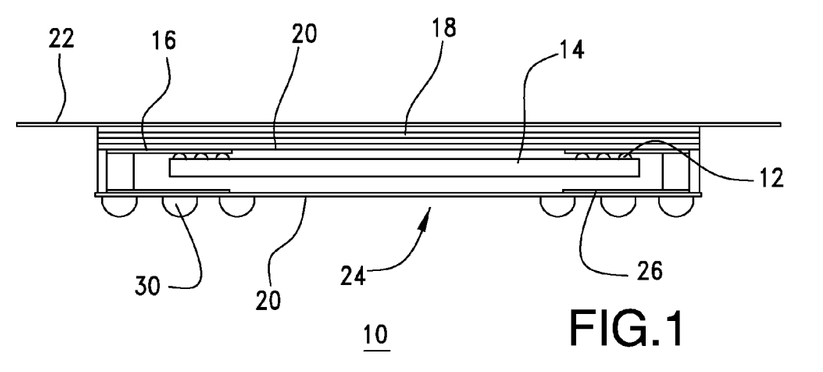
FIG. 1 is a cross-sectional view showing the overall configuration of a heat sink package, according to the Present Disclosure.

Referring to the Figures, FIG. 1 is a cross-sectional drawing showing the overall configuration of a heat sink package 10 according to one embodiment of the Present Disclosure. The electrode terminals 12 of electronic components, such as an LSI Chip 14, are electrically connected to the required locations on the wiring 16, on a heat sink substrate 18 with wiring formed through tape material 20. The term "heat sink substrate," as used in this Disclosure, means an item having not only heat sink functions, but also having functions of a mounting substrate for the purpose of electronic components, such as an LSI Chip mounted on top thereof. This heat sink substrate 18 has at least one metal plate (copper plate) 22 stacked, and this metal plate 22 is formed in a wing-like shape, extended left and right, or forward, backward, left and right, as a heat connector emitting heat therefrom to an external chassis etc., however the heat sink substrate 18 structure itself may be configured in any shape. The heat sink substrate 18 structure may be configured by stacking a multiplicity of metal plates as shown in the illustration, or may possibly also be by means of a heat pipe configuration, such as that described as prior art with reference to FIG. 16, or a wick configuration (stacking in a net pattern to create a capillary effect). In the example shown in FIG. 1, a copper plate is laminated onto the reverse side from the LSI Chip 14 mounting surface (the uppermost surface), and this is extended to left and right.

Post electrode components 24 with attached wiring are mounted onto the wiring 16 on the heat sink surface. The post electrode components 24 with attached wiring, as described below with reference to FIG. 3 or 4), are configured with a horizontal wiring part 26 and a post electrode, connected as one unit by means of a support part configured by means of a support plate and insulating tape material affixed to this support plate. These post electrode components 24 with attached wiring are fixed all together and electrically connected on the heat sink substrate 18, and after filling with resin, the support panel is peeled off. In FIG. 1, the state after peeling is shown. The insulating tape material exposed by peeling functions as a protective layer 28. After this, on the back side surface, holes are opened in the protective film 28 to form external electrodes 30, or bump electrodes, connected to the horizontal wiring part.

Figure 2A:
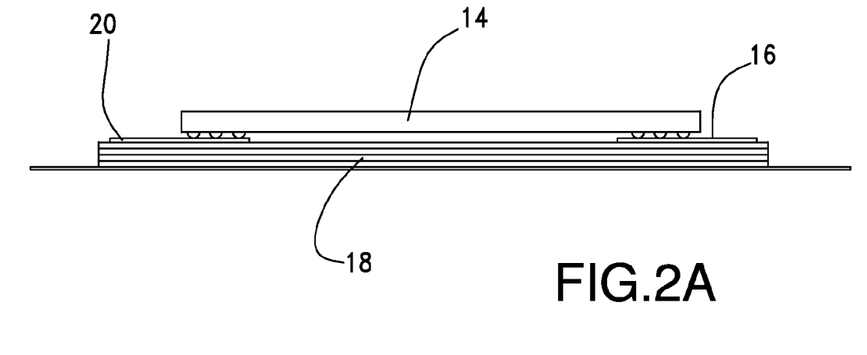
FIG. 2(A) is a cross-sectional view showing electronic components such as an LSI Chip mounted on a heat sink substrate having wiring, and (B) is an oblique view thereof.
Figure 2B:
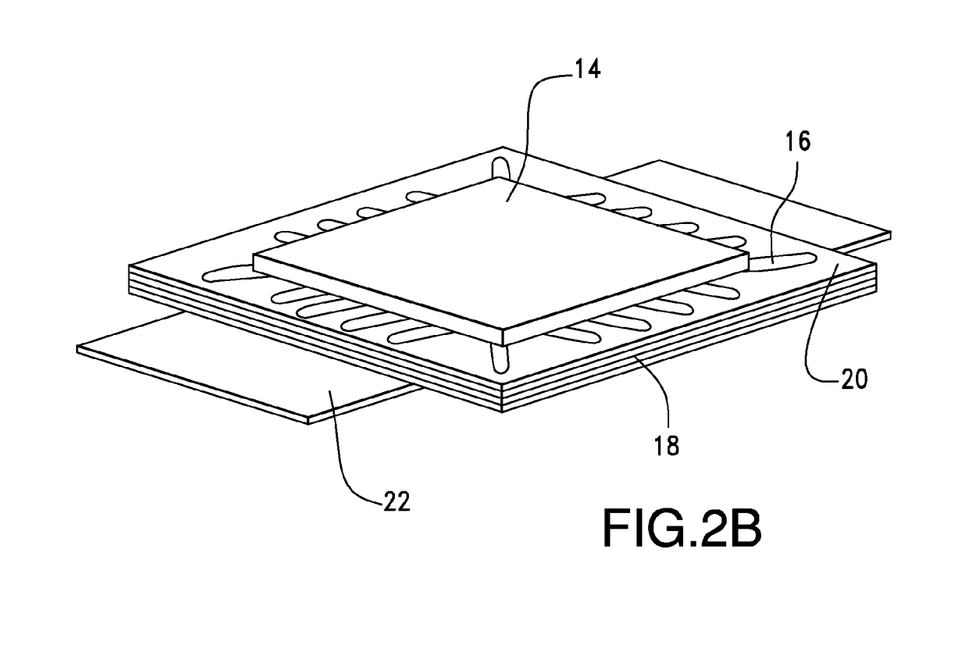

The manufacture of the heat sink package 10 shown in FIG. 1 can be explained with reference to FIGS. 2-8. FIG. 2(A) is a cross-sectional view showing electronic components, such as an LSI Chip 14, mounted on a heat sink substrate 18 having wiring, and FIG. 2(B) is an oblique view thereof. The front side of the heat sink substrate 18 has wiring 16 through a tape material 20. On the substrate where wiring 16 is formed in this manner, the electrode terminals of an electronic component, such as an LSI Chip 14, are electrically connected to the required places in the wiring pattern. Specifically, the electronic component 14 is mounted onto the heat sink substrate 18 with the wiring pattern by a flip chip method whereby the electronic component 14 is bonded using a die bonding material. Also, it is possible to connect to the wiring pattern by means of a bonding wire (wire bond connection method). Note also in regard to the manufacture of the heat sink substrate 18, that in actual manufacture, as described below with reference to FIGS. 10-2, in the assembly of the heat sink package 10 many are connected in one unit onto a heat sink substrate 18, and then after assembly is complete, the individual chips are cut apart individually.

Figure 3A:
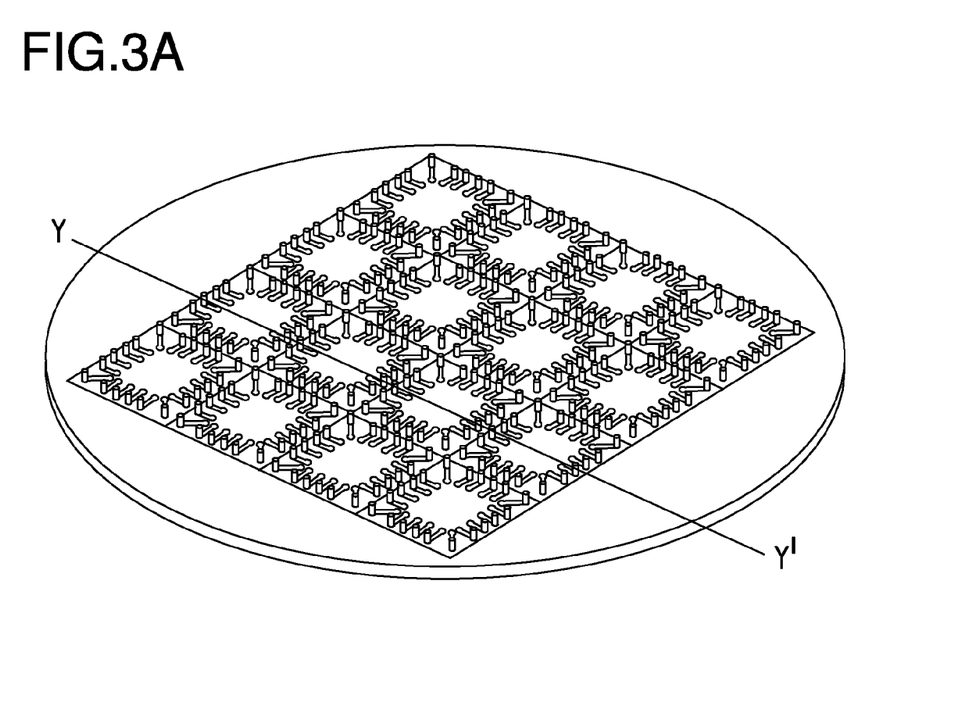
FIG. 3(A) is an oblique view showing post electrode components, and a cross sectional view of a section across Line Y-Y' in FIG. 3(B)
Figure 3B:
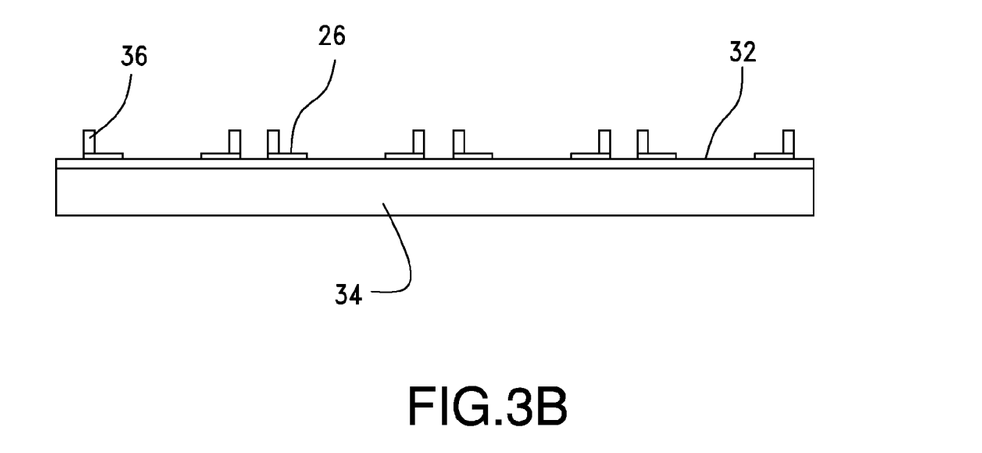

FIG. 3(A) is an oblique view showing post electrode components, showing a large number connected in combination, and a cross-sectional view of a section across Line Y-Y' in the drawing is shown in FIG. 3(B). In FIGS. 3(A) and (B), a tape made of a thin film insulating material 32, such as polyimide tape or a tape of insulating material with copper leaf affixed to one entire side of a support plate (such as a stainless steel plate, silicon plate or glass) and used as a supporting part. This insulating material tape 32 functions as a protective layer covering the wiring layer in the finished product. The support plate 34 is peeled away from the insulating material tape 32 in a later process. For this reason, the processing is applied in advance to make the tape 32 separate more easily from the stainless steel plate, silicon plate or glass when a temperature higher than the flow temperature (higher than the molding temperature) is applied. For example, an adhesive that separates easily at high temperature, or containing heat capsules, may be used, or a supporting part of material transparent to light (heat resistant low-expansion glass, etc.) may be used with an adhesive that separates under UV light. A thermally reversible adhesive may also be used.

Further, in the event that the tape 32 is of insulating material only, a metal seed layer may be formed as a metal wiring pattern (horizontal wiring part) thereon, forming a tape with metal attached. This seed layer may be, for example, gold, silver, bronze or palladium leaf, capable of use in copper plating. The pattern of the horizontal wiring part is coated with resist onto the seed layer, then the pattern is exposed to light and developed, then etched, and the resist is removed to complete the process. The wiring layer is grown on this seed layer by means of plating. Further, post parts are grown by plating on top thereof, by performing resist coating and developing. Alternatively, it is possible to omit the lithography process by pattering the horizontal wiring part with the seed layer directly with metal nanogranules. Then as described above, post parts are grown by plating on top thereof, by performing resist coating and developing. And the post electrode component with attached wiring 24 is completed by this means.

When using insulative material tape 32 with copper plating, the copper plating may be formed into a horizontal wiring pattern by means of lithography. Then, post parts are grown by plating on top thereof, by performing resist coating and developing. And the post electrode component with attached wiring 24 is completed by this means.

Figure 4:
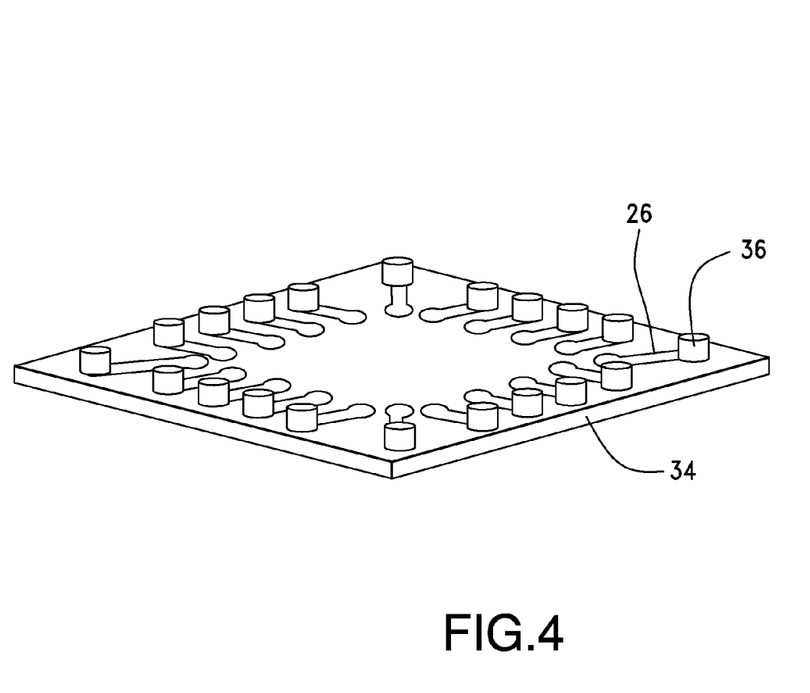
FIG. 4 is an oblique view showing a conventional post electrode component with wiring.

FIG. 4 is an oblique view showing a post electrode 36 with wiring. Generally known components may be used in place of the aforementioned post electrode 36 with wiring attached. Such electrode components 36 have wiring components build in, forming wiring patterns (the horizontal wiring portion) by means such as electroforming on the support plate 34 when peeled away in a later process.

Figure 5:
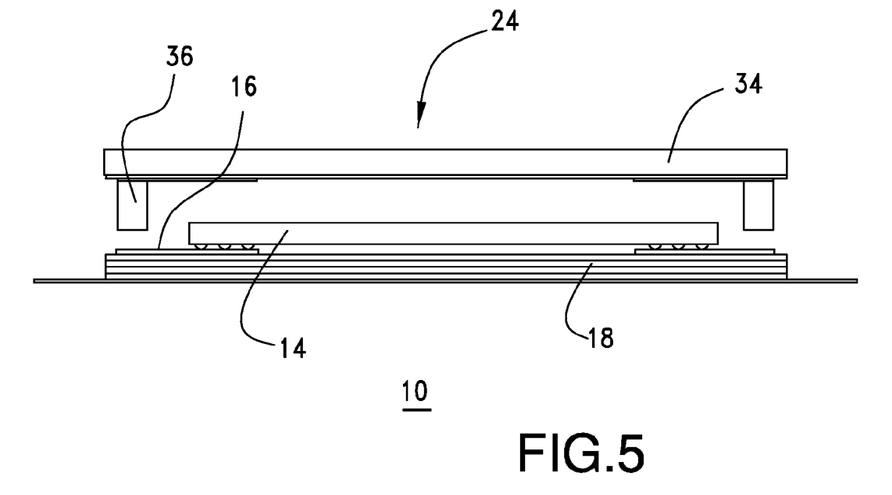
FIG. 5 is a cross-sectional view showing a post electrode component with wiring on a heat sink substrate whereon an LSI Chip is mounted.
Figure 6:
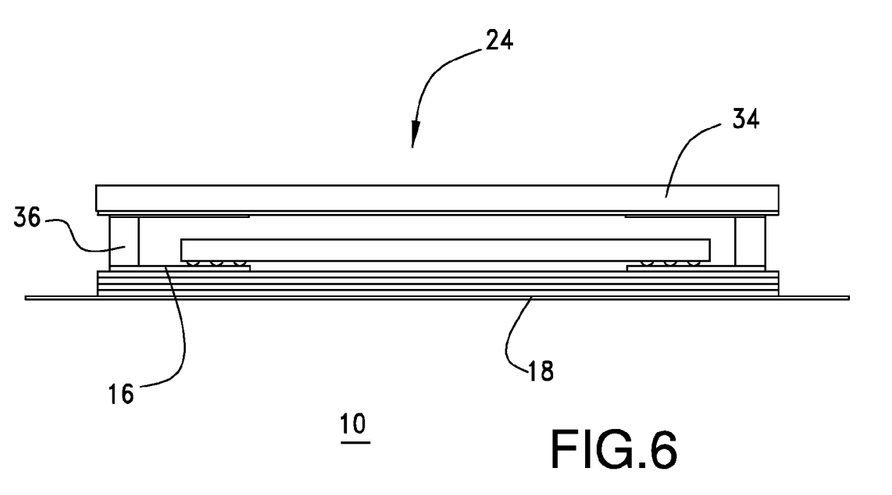
FIG. 6 is a drawing showing a post electrode component with wiring connected and fixed on a heat sink substrate.

FIG. 5 is a cross-sectional view showing a post electrode component 24 with wiring on a heat sink substrate 18 as shown in FIG. 3 or 4, whereon an LSI Chip 14 is mounted. FIG. 6 is a drawing showing a post electrode component with wiring connected 24 and fixed on a heat sink substrate 18. Post electrode components with wiring 24 and linked in one unit by the supporting plate 34 are affixed all together and connected electrically at designated positions in the wiring formed on the heat sink substrate 18. Methods of affixing and connecting post electrodes 36 include (1) joining by ultrasound waves, (2) connection by means of a conductive paste such as silver paste, (3) solder connection and (4) creating a recessed part in a metal pad part for connecting electrodes placed on an organic substrate side, while also placing a protruding part on the post electrode 36 component side and inserting and press fitting, or inserting and crimping these together. At the stage where post electrodes 36 are affixed in designated positions on the wiring pattern, all post electrodes 36 are connected in one unit by means of the plate-shaped supporting plate 34.

Figure 7:
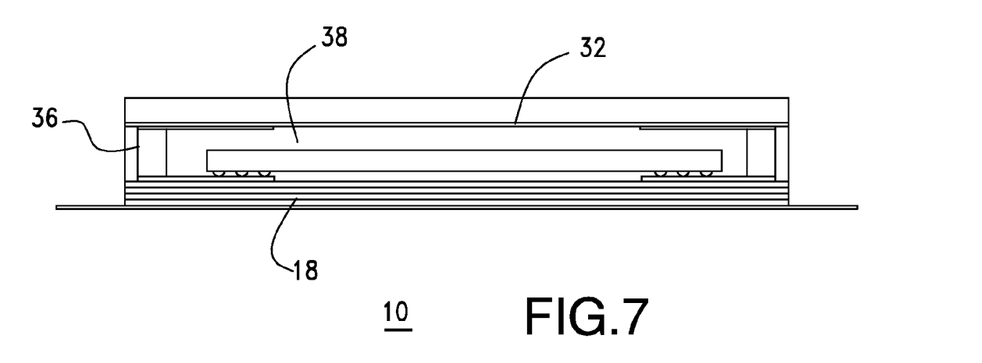
FIG. 7 is a drawing showing a post electrode after fixing, filled with resin.

FIG. 7 is a drawing showing a post electrode 36 after fixing, filled with resin 38. The drawing shows only one component, but actually multiple such units are linked together, placed in a mold and filled with resin 38. By this means, resin 38 filling is done by transfer molding so as to fill the space between the heat sink substrate 18 and insulative material tape 32, or by using liquid resin (a material such as an epoxy).

Figure 8:
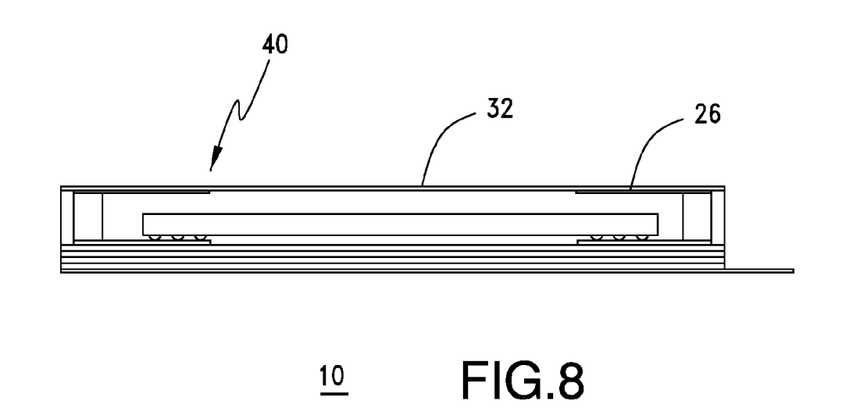
FIG. 8 is a drawing showing the state after the support plate is peeled away.

FIG. 8 is a drawing showing the state after the support plate is peeled away 40. By peeling away the support plate, the insulative material tape 32 covering the wiring layer is exposed. The insulative material tape 32 functions as a protective film for the finished product.

Next, a completed heat sink-combined package, inverted top to bottom, with external electrodes connected, equivalent to that described in FIG. 1, is described. On the back side, holes are opened in the protective film, and external electrodes (bump electrodes) connected to the horizontal wiring part are formed. Or, if post electrode components with attached wiring are used as shown in FIG. 4, no protective film exists, but protective film can be coated over the horizontal wiring part as necessary. By using this horizontal wiring part, it is possible to bring the position of external electrodes of the heat sink-combined package out from the post electrode layout as desired. For this reason the heat sink package can be connected easily in three dimensions. In actual manufacturing, after this point after individual chips are cut apart into single pieces, the product is completed. By this means, a heat sink package is completed with external electrodes (bump electrodes) formed, and a horizontal wiring part connected to an LSI chip.

Figure 9:
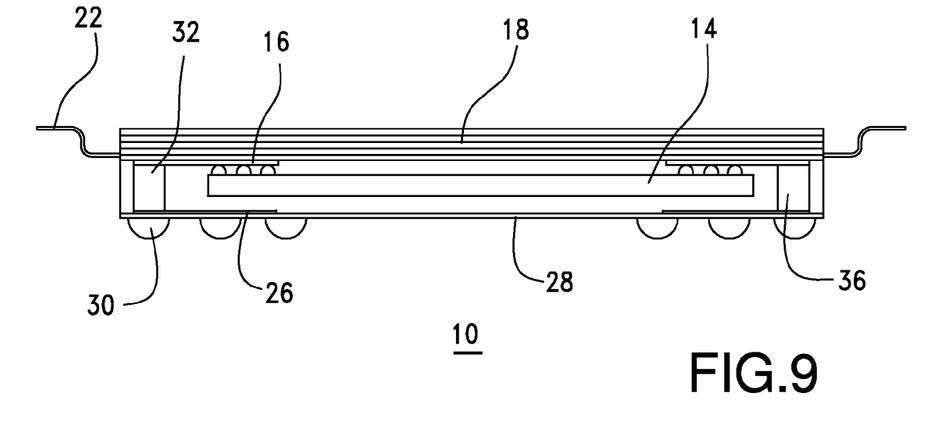
FIG. 9 is a cross-sectional drawing showing the overall configuration of a heat sink-combined package according to the Present Disclosure.

FIG. 9 is a cross sectional drawing showing the overall configuration of a heat sink package 10 according to another embodiment of the Present Disclosure. This differs from the previously described embodiment only in the configuration of the heat sink substrate 18. The heat sink substrate 18 shown in FIG. 9, like that in the previously described embodiment, is a structure with at least one metal plate 22 (copper plate) stacked, and one portion of the stacked plate 22 is formed in a wing-like shape, extended left and right, or forward, backward, left, and right, as a heat connector emitting heat to an external chassis, and it is the panel on the side closer to the LSI Chip 14 mounting surface (the lower surface) that is extended. Also, as in the previously described embodiment, the lowest side of the heat sink substrate 18 has wiring 16 passing through the tape material 32. By this means, in the event that the heat sink package 10 is connected to a chassis, the heat sink 10 may be given a spring effect and thereby contact the chassis more strongly.

Next is a description of the manufacture of a heat sink with wiring formed, using an example whereby six heat sink substrates are formed together, with reference to FIGS. 10-2. The heat sink substrate 18 shown in FIGS. 10-2 is equivalent to the aforementioned embodiment with the plate extended on the side nearer to the LSI Chip 14 mounting surface, and the manufacturing technology explained below only changes the position of the stacked metal plate 22 to the side farther from the LSI Chip 14 mounting surface, and thus enables the manufacture of a heat sink substrate 18 that can be used in the initial embodiment.

Figure 10A:
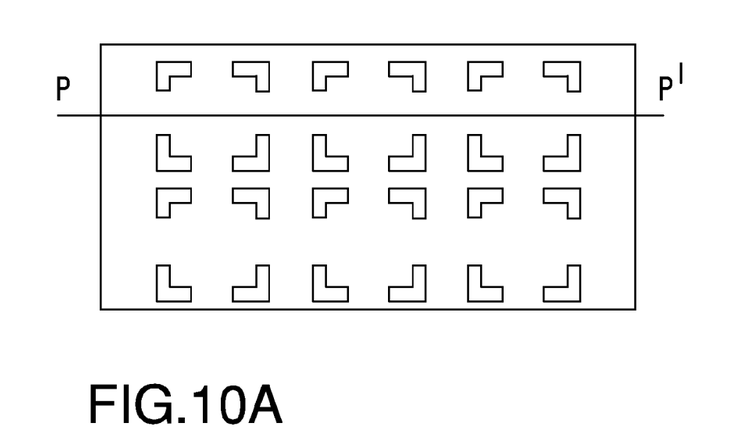
Figure 10B:
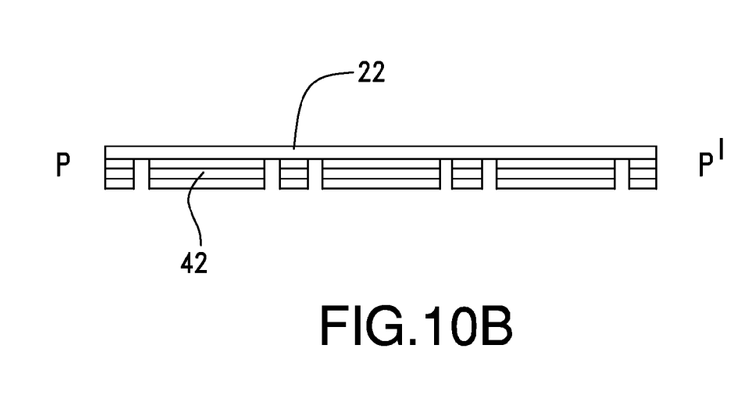

FIG. 10(A) is a flat drawing of a multi-layer laminated plate (heat sink body) 12 with a metal plate 22 affixed, and FIG. 10(B) is a cross-sectional view of a section across Line P-P'. Here, the heat sink body 12 is shown as a multiplayer stacked plate of multiple metal plates 22 laminated together. However, the Present Disclosure is not limited to a multilayer stacked plate, and may also use various forms and structures including a heat pipe structure.

In stacking each heat sink body part 42, multiple package parts are stacked as one plate, with protruding parts attached that can afterwards be easily cut off. On the uppermost (or lowermost) surface of such a heat sink body 42, one metal plate (copper plate) 22 is laminated using, for example, an adhesive (in this Disclosure, a heat sink body and a metal plate laminated thereto are collectively referred to as a heat sink). In this laminated stacked plate 22, as shown in FIG. 10(A), by previously cutting away the corner parts of each package, it is possible to form a thermal connector by just cutting the outer edges in a later process (see FIG. 12(A)). FIG. 10 shows an example whereby a thermal connector is made by extending the four sides forward, backward, left, and right. However, this need not necessarily be forward, backward, left and right, and may also be two opposite sides (in the drawing, the left and right, or forward and back sides) or one side only.

Figure 11A:
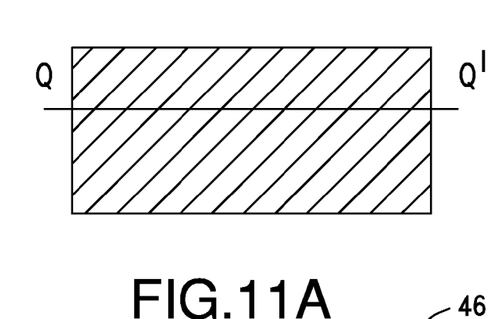
Figure 11B:
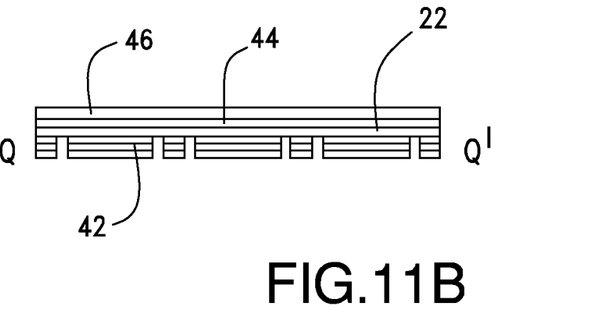

Next, a tape material 44 with copper leaf 46 is laminated onto the metal plate 22. FIG. 11(A) is a flat drawing of the state with the tape material 44 affixed, and FIG. 10(B) is a cross-sectional view of a section across Line Q-Q'. As for the tape material 44 with copper plate 46, a tape with metal attached is formed by vapor deposition or adhesion of a low-resistance metal film intended as a wiring pattern, over the entire surface of a thin film tape. The metal film may be, for example, gold, silver, copper or palladium leaf. Alternatively, in place of vapor deposition or adhesion of the metal film, it is also possible to use thin film tape and thin metal film (such as copper leaf) made as one unit.

Figure 12A:
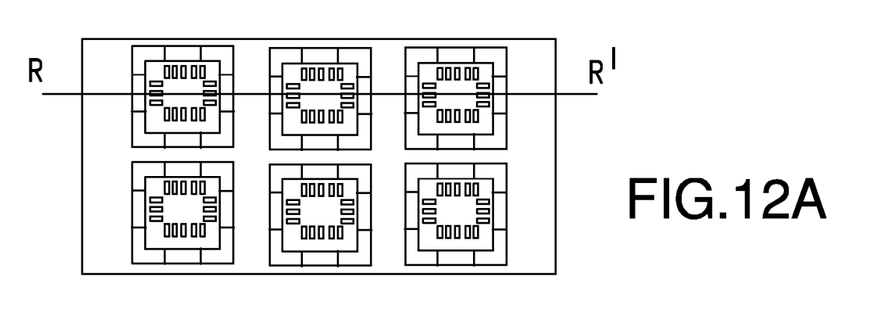
Figure 12B:
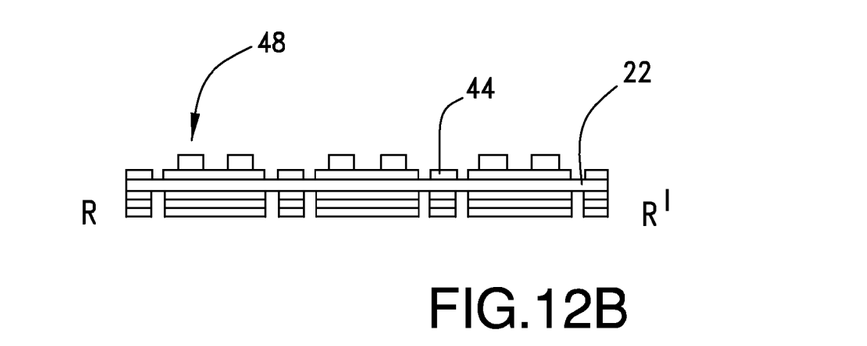

Next a wiring pattern is formed, as shown in FIG. 12. FIG. 12(A) is a flat drawing showing a completed heat sink substrate, and FIG. 12(B) is a cross-sectional view of a section across Line R-R'. In forming the wiring pattern, resist is coated onto a metal layer (copper leaf), the pattern is exposed, and developed, then etched, and then the resist is removed, completing the wiring pattern 48. On multiple such individual linked heat sink substrates, heat sink packages will be assembled in a later process, and after completion will be cut into separate individual substrates.

Figure 13:
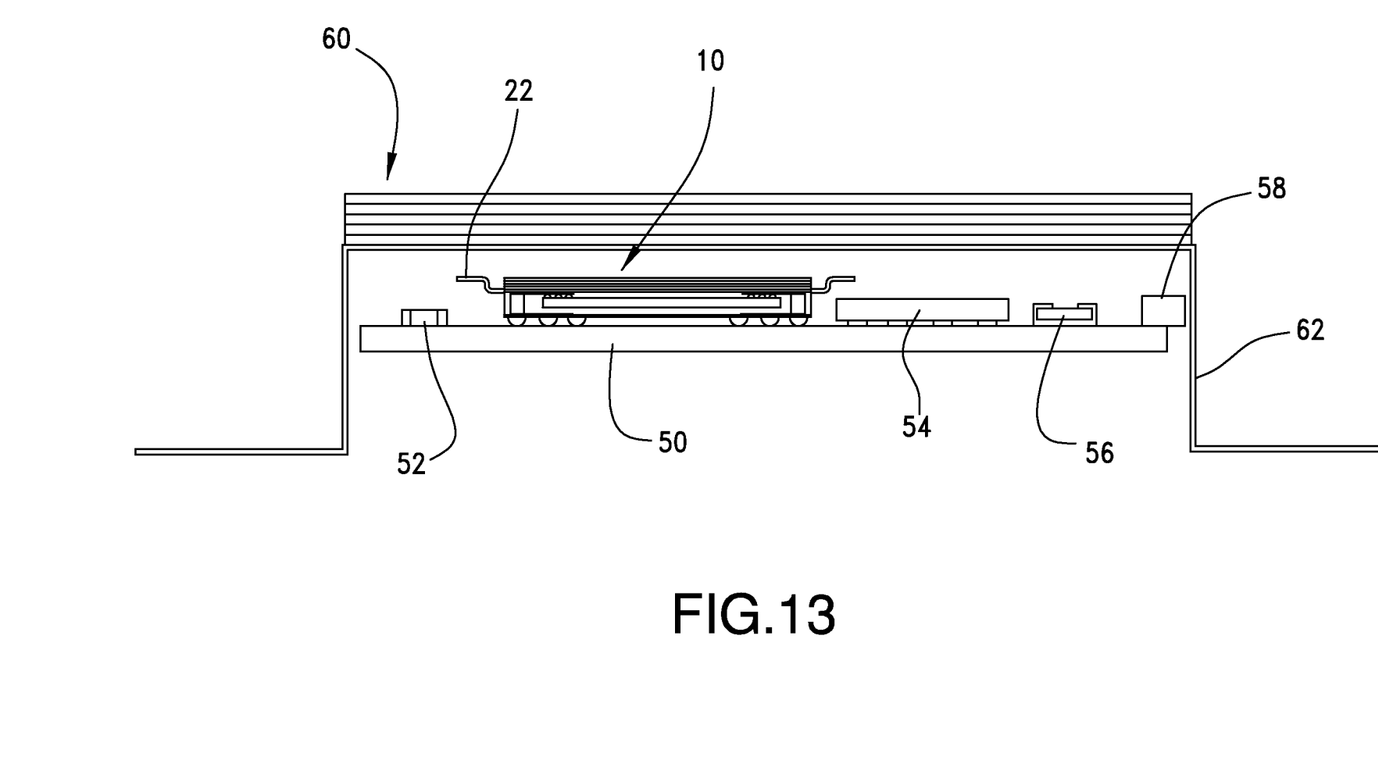
FIG. 13 is an explanatory drawing of one example of a method of use of a thermal connector of a heat sink-combined package.

FIG. 13 is an explanatory drawing of one example of a method of use of a thermal connector of a heat sink package 10. On a printed circuit board 50 having a wiring layer are mounted electronic circuit elements such as resistors 52, integrated circuits 54, capacitors 56 and connectors 58, as well as a heat sink package 10 according to the aforementioned embodiment. This printed circuit board 50 is affixed to a chassis 60. The chassis 60 itself may have the same construction as the aforementioned heat sink substrate 18. Specifically, the chassis 60 shown in FIG. 13 is configured with one copper plate 62, and that one copper plate is extended, with the extended parts being bent into prescribed shapes, and thereby configuring a printed circuit board mounting part.

Figure 14:
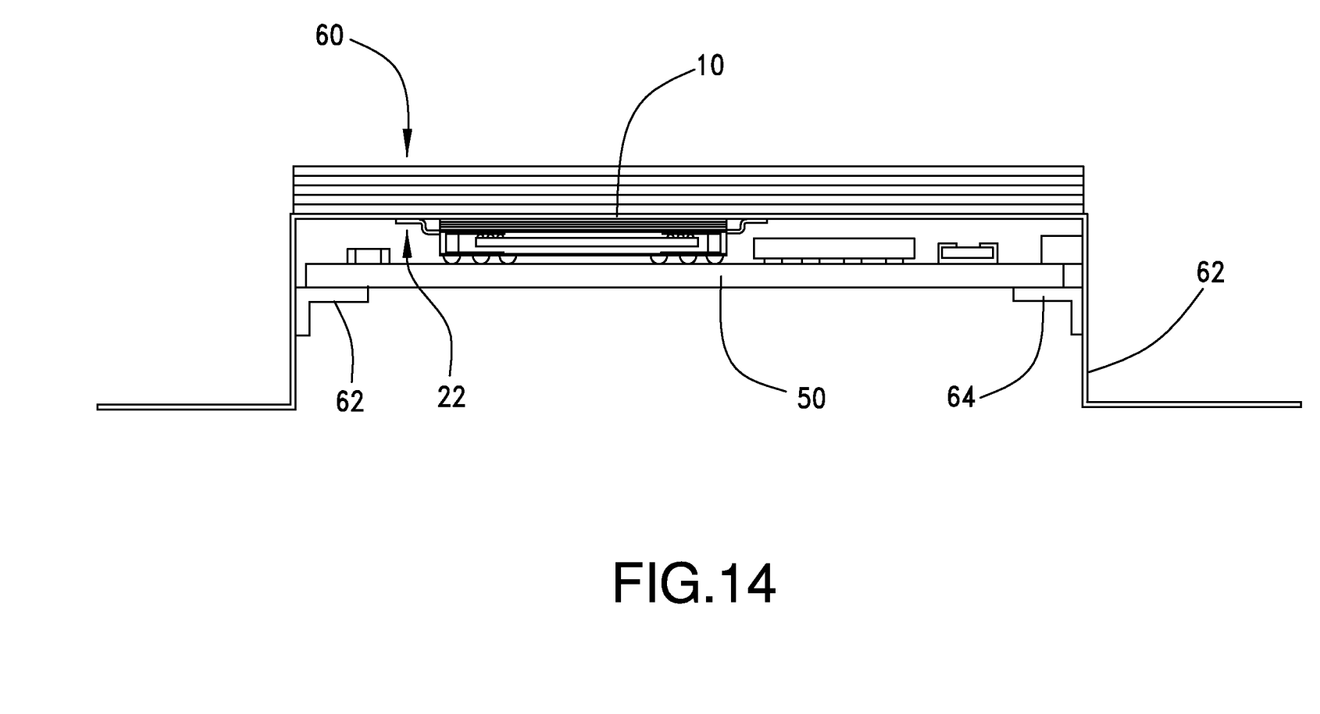
FIG. 14 is a drawing showing the state after attachment and fixing.
Figure 15:
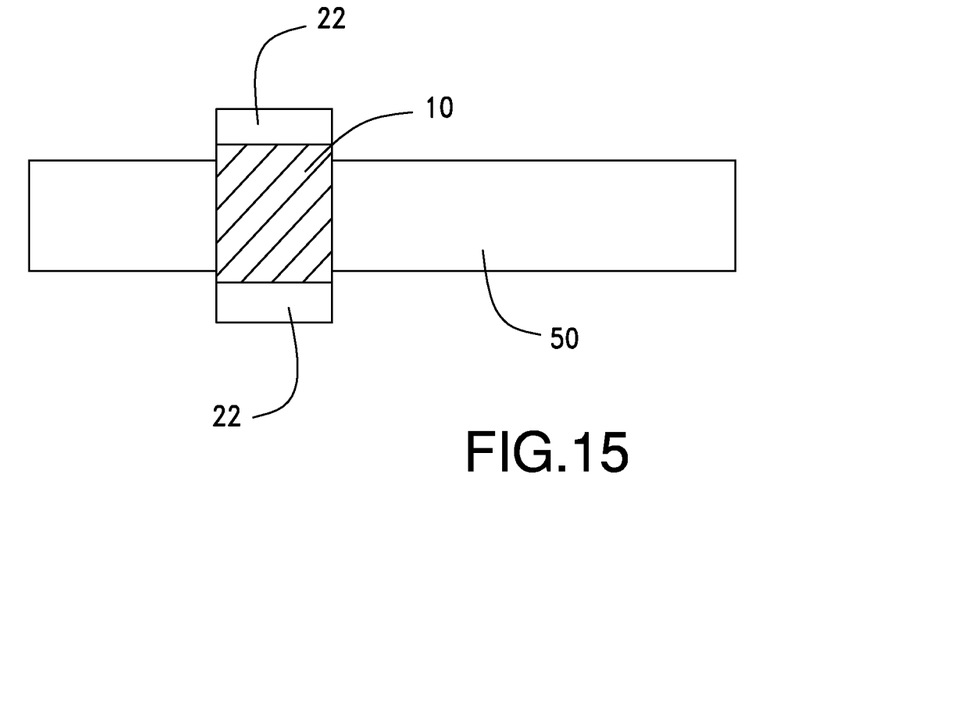
FIG. 15 is a top view of a printed circuit board with heat sink package mounted.

As shown in FIG. 13, the printed circuit board 50 with electronic circuit elements 10, 52-8 mounted thereon is moved from place where it was positioned inside the chassis 62 to a prescribed mounting position higher up, and is attached and fixed there. FIG. 14 is a drawing showing the state after attachment and fixing. The printed circuit board 50 is fixed to the extended part of the chassis 60, and also the thermal connector 22 of the heat sink package 10 is fixed to a connecting part against the laminated part of the chassis 60. Mounting of the printed circuit board 50 to the extended part of the chassis may be performed with screws, for example, using a mounting jig 62 as shown. Also, mounting of the thermal connectors 22 of the heat sink package 10 to the laminated part of the chassis 60 may be performed by screws, insertion or crimping, etc. Here, insertion refers to placing insertion openings in the side of the chassis 60 beforehand, and inserting the connector part into these. Crimping refers to pressing the connector part and the chassis part simultaneously to create a protruding and recessed part together. In order to make fixing by means of screws easier, a configuration may be used whereby the thermal connectors of the heat sink package protrude from the side of the substrate, as shown in FIG. 15. FIG. 15 is a drawing of a printed circuit board 50 with heat sink package 10 mounted, viewed from above. The operation of attaching screws from the lower side of the printed circuit board 50 is facilitated by having the thermal connector protrude from both side surfaces of the printed circuit board 50. Heat generated by the heat sink package 10 can be eliminated to the outside from the thermal connectors to the laminated part of the chassis 60 to the outside, and further from there through the extended part of the chassis 60 to the outside.

While a preferred embodiment of the Present Disclosure is shown and described, it is envisioned that those skilled in the art may devise various modifications without departing from the spirit and scope of the foregoing Description and the appended Claims.

What is claimed is:

1. A heat sink-combined package, comprising:
   electronic components mounted on a heat sink substrate;
   wherein:
      the heat sink substrate is comprised of laminations of at least one metal layer, whereby each metal layer is extended in a horizontal direction parallel to the electronic components, thereby forming a thermal connector conducting heat generated by said electronic components therefrom to the outside;
      electronic components are mounted on the heat sink substrate whereon wiring is formed, and electrode terminals of the electronic components are electrically connected to necessary positions on the wiring;
      a post electrode component, comprising an insulative material and wiring disposed thereon, the wiring having a horizontal wiring portion and a post electrode, is mounted on the wiring on the heat sink substrate; and
      an external electrode is formed connected to the horizontal wiring portion.

2. The heat sink-combined package of claim 1, wherein a printed circuit board whereon the heat sink-combined package is mounted is installed inside a chassis.

3. The heat sink-combined package of claim 2, wherein the thermal connector is connected and affixed to the chassis.

4. The heat sink-combined package of claim 3, wherein the chassis is comprised of laminations of at least one metal layer.

5. The heat sink-combined package of claim 4, wherein each metal layer is extended and the extended part is bent in a prescribed shape, and thereby configures a mounting part for the printed circuit board.

* * * * *